United States Patent
Yi et al.

(10) Patent No.: US 12,386,275 B2
(45) Date of Patent: Aug. 12, 2025

(54) LITHOGRAPHY APPARATUS

(71) Applicant: SAMSUNG ELECTRONICS CO., LTD., Suwon-si (KR)

(72) Inventors: Kyung Chin Yi, Suwon-si (KR); Dong Sik Jeong, Suwon-si (KR); Sun Ho Kim, Suwon-si (KR); Woo-Hyung Kim, Suwon-si (KR); Seung Uk Park, Suwon-si (KR); Yong Hee Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 18/388,298

(22) Filed: Nov. 9, 2023

(65) Prior Publication Data
US 2024/0353764 A1 Oct. 24, 2024

(30) Foreign Application Priority Data

Apr. 19, 2023 (KR) .................. 10-2023-0051275
Jun. 9, 2023 (KR) .................. 10-2023-0074306

(51) Int. Cl.
*G03F 7/20* (2006.01)
*G03F 7/00* (2006.01)

(52) U.S. Cl.
CPC ...... *G03F 7/70916* (2013.01); *G03F 7/70725* (2013.01); *G03F 7/70808* (2013.01); *G03F 7/7095* (2013.01); *G03F 7/70991* (2013.01)

(58) Field of Classification Search
CPC ............. G03F 7/70916; G03F 7/70725; G03F 7/70808; G03F 7/7095; G03F 7/70991
See application file for complete search history.

(56) References Cited

U.S. PATENT DOCUMENTS

2022/0066331 A1* 3/2022 Wang ................. G03F 7/70716

FOREIGN PATENT DOCUMENTS

| JP | 2018-189748 A | 11/2018 | |
|---|---|---|---|
| KR | 10-2013-0033306 A | 4/2013 | |
| KR | 10-1727501 B1 | 4/2017 | |
| KR | 10-1995954 B1 | 7/2019 | |
| KR | 10-20182233 B1 | 11/2020 | |
| KR | 10-2022-0068810 A | 5/2022 | |
| TW | 201622282 A * | 6/2016 | ............. H02G 11/00 |

* cited by examiner

*Primary Examiner* — Mesfin T Asfaw
(74) *Attorney, Agent, or Firm* — Sughrue Mion, PLLC

(57) ABSTRACT

Provided is a lithography apparatus including a wafer stage, a cable connected to the wafer stage, the cable being configured to bend based on the wafer stage moving, a support unit configured to prevent the cable from sagging, the support unit including a plurality of clamps configured to restrict movement of the cable and a connection member connecting the plurality of clamps to each other, and a protective unit under the cable, the protective unit being configured to collide with the support unit based on the wafer stage moving, wherein the protective unit includes ultra-high molecular weight polyethylene (UHMWPE).

20 Claims, 10 Drawing Sheets

LITHOGRAPHY APPARATUS

CROSS-REFERENCE TO RELATED APPLICATION

This application claims priority to Korean Patent Application No. 10-2023-0051275 filed on Apr. 19, 2023 and Korean Patent Application No. 10-2023-0074306 filed on Jun. 9, 2023 in the Korean Intellectual Property Office, the disclosures of which are incorporated herein in their entireties by reference.

BACKGROUND

1. Field

Embodiments of the present disclosure relate to a lithography apparatus, and more specifically, to a lithography apparatus using extreme ultraviolet (EUV).

2. Description of Related Art

EUV lithography provides a finer pattern resolution than a resolution which can be achieved using optical lithography, and thus, is currently considered a candidate for next-generation lithography. Increasing the resolution using the EUV lithography stems from a fact that the optical lithography is performed using a wavelength in a range of 150 to 250 nm, whereas the EUV lithography is performed using a wavelength in a range of 11 to 15 nm. In general, the shorter the wavelength of the light used for pattern imaging in lithography, the finer the resolution that can be obtained.

An EUV lithography apparatus needs to move a mask and a wafer to form a pattern. The mask or the wafer moves on a stage. Particles are produced due to collision or abrasion between units connected to each other during an operation of the stage. These particles contaminate the wafer and cause decrease in yield.

Therefore, a lithography apparatus that reduces the production of the particles during the operation of the stage is required.

SUMMARY embodiments are One or more embodiments provide a lithography apparatus in which a material usable in the lithography apparatus is used as a material of a protective unit such that particle production is reduced.

According to an aspect of an embodiment, there is provided a lithography apparatus including a wafer stage, a cable connected to the wafer stage, the cable being configured to bend based on the wafer stage moving, a support unit configured to prevent the cable from sagging, the support unit including a plurality of clamps configured to restrict movement of the cable and a connection member connecting the plurality of clamps to each other, and a protective unit under the cable, the protective unit being configured to collide with the support unit based on the wafer stage moving, wherein the protective unit includes ultra-high molecular weight polyethylene (UHMWPE).

According to another aspect of an embodiment, there is provided a lithography apparatus including a chamber, a body plate in the chamber, the body plate including a first surface and a second surface opposite to the first surface, a stage configured to move on the first surface of the body plate, a cable on the stage and extending to the second surface of the body plate, the cable being configured to bend based on the stage moving, a support unit configured to prevent the cable from sagging, a grounding unit on the support unit, and a protective unit under the cable, the protective unit being configured to collide with the support unit, wherein the protective unit includes ultra-high molecular weight polyethylene (UHMWPE).

According to another aspect of an embodiment, there is provided a lithography apparatus including a chamber, a wafer stage in the chamber and configured support a wafer, a cable on the wafer stage, the cable being configured to bend based on the wafer stage moving, a support unit configured to prevent the cable from sagging, the support unit includes a plurality of clamps configured to restrict movement of the cable and a connection member connecting the plurality of clamps to each other, a grounding unit on the support unit, and a protective unit under the cable, the protective unit being configured to collide the support unit based on the wafer stage moving, wherein the protective unit includes UHMWPE.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTIONS

Embodiments described herein are example embodiments, and thus, the disclosure is not limited thereto.

Figure 1:
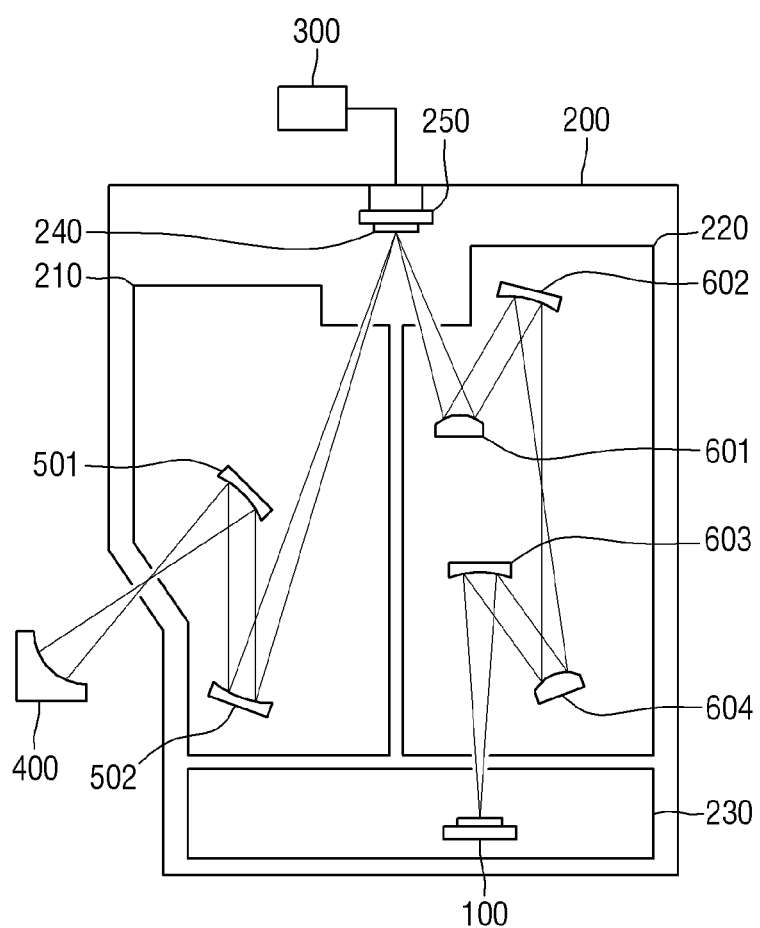
FIG. 1 is a diagram illustrating a lithography apparatus according to some embodiments.

FIG. 1 is a diagram illustrating a lithography apparatus according to some embodiments.

Referring to FIG. 1, the lithography apparatus according to some embodiments may include a main chamber 200, a first sub-chamber 210, a second sub-chamber 220, a third sub-chamber 230, a reticle stage 250, a reticle stage power supply 300, a light source 400, an illumination system mirror 501 and 502, a projection optical-system mirror 601, 602, 603, and 604, and a wafer stage 100.

An inner space of the main chamber 200 may be maintained in a vacuum state. For example, an inner space of each of the first sub-chamber 210, the second sub-chamber 220, and the third sub-chamber 230 may be maintained in a vacuum state.

The first sub-chamber 210 may be disposed in the main chamber 200. At least one illumination system mirror 501 and 502 may be disposed in the first sub-chamber 210.

An exposure light reflected from the illumination system mirror 501 and 502 and then passing through the first sub-chamber 210 may reach a reticle 240 fixed to the reticle stage 250. In order to increase efficiency in reflection of the exposure light, the inner space of the first sub-chamber 210 may be maintained in a vacuum state.

The second sub-chamber 220 may be disposed in the main chamber 200. At least one projection optical-system mirror 601, 602, 603, and 604 may be disposed in the second sub-chamber 220.

The reticle stage 250 may be disposed on a top surface of the main chamber 200. The reticle 240 may be fixed onto the reticle stage 250. The reticle stage 250 may perform a scanning operation. The reticle stage 250 may perform a stepping operation.

The reticle 240 may reflect the exposure light which has passed through the first sub-chamber 210 toward the second sub-chamber 220. The exposure light which has passed through the first sub-chamber 210 may be incident on a first surface of the reticle where a pattern area is formed.

A remaining portion of the exposure light not absorbed by the pattern area of the first surface of the reticle 240 may be incident on the first projection optical-system mirror 601 disposed in the second sub-chamber 220.

The exposure light reflected by the first surface of the reticle 240 into the second sub-chamber 220 may be sequentially reflected from the first to fourth projection optical-system mirrors 601, 602, 603, and 604, and then, may be transmitted into the third chamber 230. For example, the exposure light reflected from the surface of the reticle 240 may be reflected from the projection optical-system mirrors 601, 602, 603, and 604 and then may be transmitted onto a wafer on the wafer stage 100. In order to increase efficiency in the reflection of the exposure light, the inner space of the second sub-chamber 220 may be maintained in a vacuum state.

The reticle stage power supply 300 is electrically connected to the reticle 240 and the reticle stage 250. Based on the reticle stage power supply 300 being connected to the reticle stage 250 and the reticle 240, an electrostatic force is generated between the reticle stage 250 and the reticle 240. For example, the reticle 240 may be fixed to the reticle stage 200 under the electrostatic force.

The light source 400 may be positioned external to the main chamber 200. The light source 400 may provide the exposure light used for lithography. The light source 400 may emit the exposure light to the illumination system mirrors 501 and 502 disposed in the first sub-chamber 210.

The light source 400 may be, for example, a discharge produced plasma (DPP) EUV light source, a laser produced plasma (LPP) EUV light source, a hybrid EUV light source, a synchrotron EUV light source, etc. However, embodiments are not limited thereto. The mirrors 501, 502, 601, 602, 603, and 604 may be included in the first sub-chamber 210 and the second sub-chamber 220. Each of the mirrors 501, 502, 601, 602, 603, and 604 may be an oblique incidence mirror in which the exposure light emitted from the light source 400 is incident on a reflective surface of the mirror at an oblique incident angle, or a multi-layer mirror in which reflective surfaces are multi-layered.

In order to transfer a fine pattern on the wafer, each of the projection optical-system mirrors 601, 602, 603, and 604 may have a relatively high resolution. The number of mirrors 501, 502, 601, 602, 603, and 604 may be, for example, six (6). However, embodiments are not limited thereto.

The third sub-chamber 230 may be positioned in the main chamber 200. The wafer stage 100 may be disposed in the third sub-chamber 230. Although one wafer stage 100 is shown in the third sub-chamber 230, embodiments are not limited thereto. For example, there may be two or more wafer stages 100 in the third sub-chamber 230. The inner space of the third sub-chamber 230 may be maintained in a vacuum state.

The wafer stage 100 may be disposed in the third sub-chamber 230. The wafer stage 100 may load the wafer thereon. The wafer may be fixed onto the wafer stage 100. The wafer stage 100 may be movable for fine alignment. The wafer stage 100 may perform the scanning operation and the stepping operation.

Hereinafter, the wafer stage 100 and components around the wafer stage 100 will be described in detail.

Figure 2:
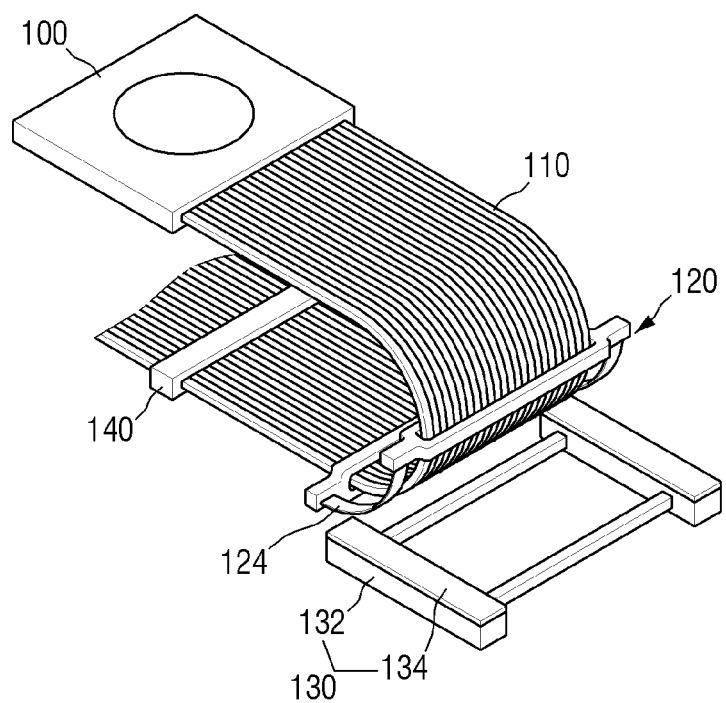
FIG. 2 is a diagram illustrating the wafer stage of FIG. 1 and a protective unit.
Figure 3:
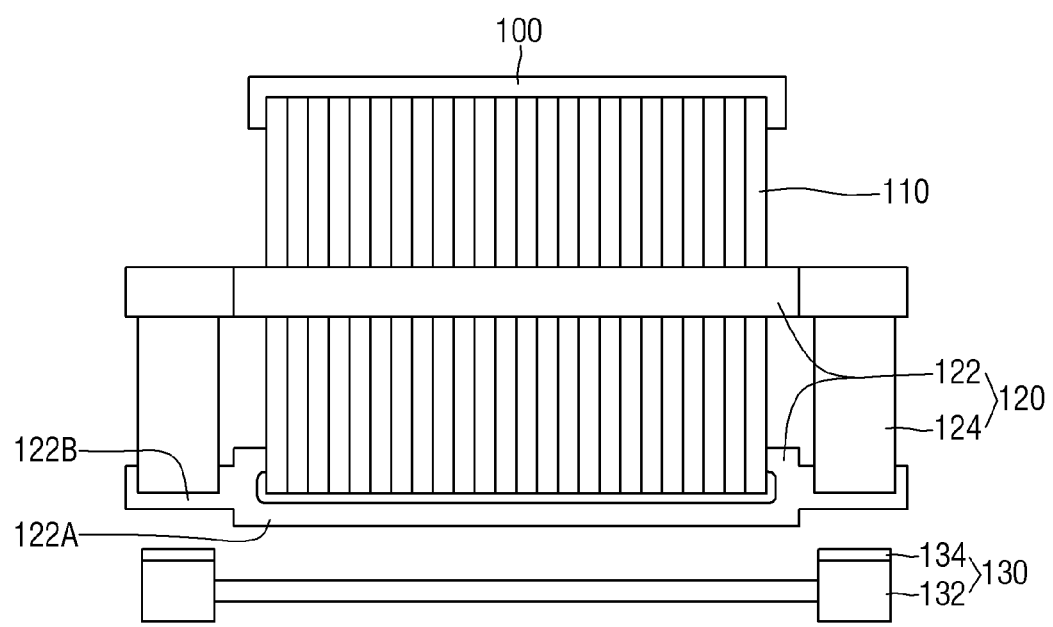
FIG. 3 is a diagram illustrating a support unit of FIG. 2.
Figure 4:
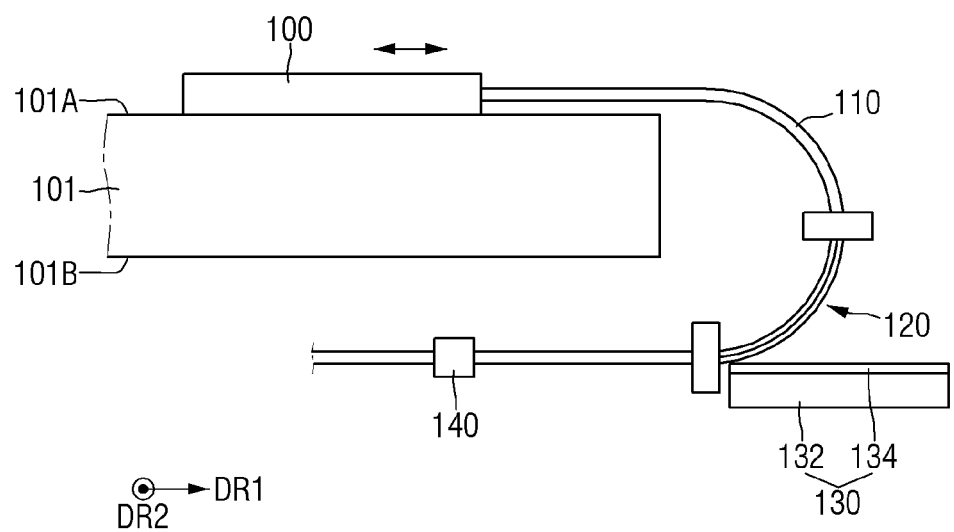
FIG. 4 and FIG. 5 are diagrams illustrating an operation of the wafer stage and a cable.
Figure 5:
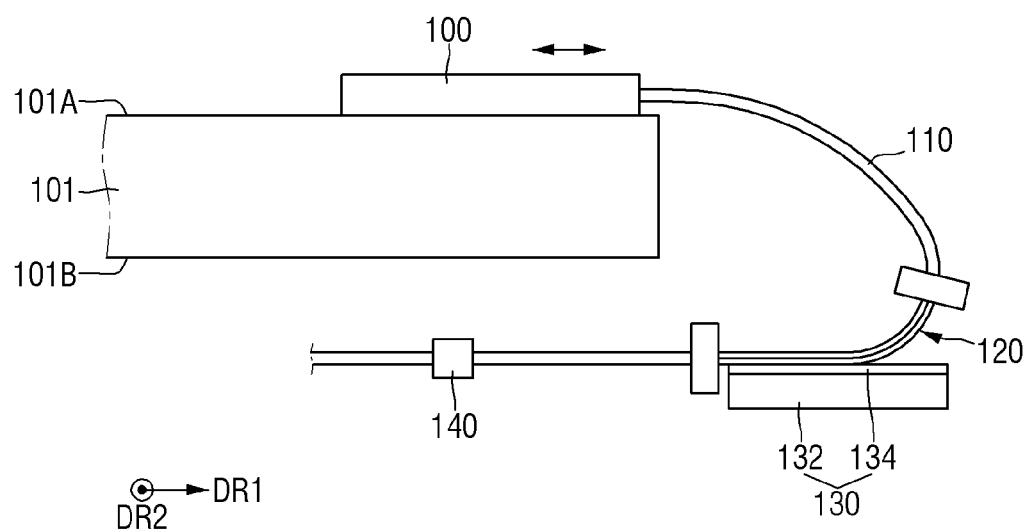

FIG. 2 is a diagram for illustrating the wafer stage of FIG. 1 and a protective unit. FIG. 3 is a diagram for illustrating a support unit of FIG. 2. FIG. 4 and FIG. 5 are diagrams for illustrating an operation of the wafer stage and a cable.

Referring to FIG. 2 to FIG. 5, a lithography apparatus according to some embodiments may include a stage 100, a body plate 101, a cable 110, a support unit 120, a protective unit 130, and a cable fixing member 140.

The body plate 101 may include a first surface 101A and a second surface 101B opposite to each other. The first surface 101A of the body plate 101 may be a surface opposite to the second surface 101B of the body plate 101. The first surface 101A and the second surface 101B of the body plate 101 may be connected to each other via a side surface of the body plate 101. The wafer stage 100 may be disposed on the first surface 101A of the body plate 101.

The wafer stage 100 may move on the first surface 101A of the body plate 101. However, embodiments are not limited thereto. In some embodiments, the wafer stage 100 may move on the second surface 101B of the body plate 101. Hereinafter, it is assumed that the wafer stage 100 moves on the first surface 101A of the body plate 101.

One end of the cable 110 may be connected to the wafer stage 100. The cable 110 may extend in a length direction. The other end of the cable 110 may be fixed to the cable fixing member 140. For example, lengths of sub-cables of the cable 110 extending from the cable fixing member 140 to the wafer stage 100 may be equal to each other. The cable 110 may be connected to the wafer stage 100 and may extend along the first surface 101A, the side surface, and the second surface 101B of the body plate 101. The cable fixing member 140 may be disposed on the second surface 101B of the body plate 101.

The cable 110 may include a plurality of sub-cables. Each of the plurality of sub-cables may extend in a length direction. The plurality of sub-cables may be clamped by a clamp 122 to be described later.

The cable 110 may be used as a path for transmitting data. For example, the cable 110 may transmit a value sensed from a sensor provided on the wafer stage 100 to an optical system in the lithography apparatus. The cable 110 may deliver a signal generated from the optical system in the lithography apparatus to the wafer stage 100.

The cable 110 may include a flexible material. For example, a sheath of the cable 110 may include a fluorine (F)-based material. The cable 110 may be bent around the side surface of the body plate 101.

The cable 110 may be connected to the wafer stage 100 and thus may be used as a path along which air and/or water flows toward the wafer stage 110.

The wafer stage 100 may move in a first direction DR1 and/or a second direction DR2 and on the first surface 101A of the body plate 101. In this regard, the first direction DR1 may be the length direction of the cable 110. The second direction DR2 may be a direction intersecting the first direction DR1. The first direction DR1 and the second direction DR2 may be parallel to the first surface 101A of the body plate 101.

As the wafer stage 100 moves in the first direction DR1, the cable 110 connected to the wafer stage 100 also moves. As the wafer stage 100 moves in the first direction DR1, an amount by which the cable 110 is bent may vary. When the wafer stage 100 moves away from a center of the body plate 101, the bent amount of the cable 110 may increase. In this case, sagging may occur at a lower portion of the cable 110. For example, the sagging of the cable 110 may occur on the second surface 101B of the body plate 101. When the cable 110 sags excessively, the data transmitted via the cable 110 may be lost. Furthermore, a speed at which the data is transmitted through the cable 110 may be decreased. When the moving speed of the wafer stage 100 is reduced so as to compensate for the data transmission rate, a yield of EUV equipment may decrease.

As the wafer stage 100 moves in the second direction DR2, the cable 110 connected to the wafer stage 100 also moves in the second direction. When the wafer stage 100 moves in the second direction DR2, the cable 110 may be twisted. When the cable 110 is twisted, the data transmitted through the cable 110 may be lost. Furthermore, a speed at which the data is transmitted through the cable 110 may be decreased.

The support unit 120 may be coupled to the cable 110. The support unit 120 may restrict the twisting of the cable 110. The support unit 120 may prevent the sagging of the cable 110. For example, the support unit 120 may prevent excessive sagging of the cable 110. Furthermore, the support unit 120 is coupled to the cable 110, thereby preventing the cable 110 from colliding with the body plate 101 when the wafer stage 100 moves.

The support unit 120 may be disposed adjacent to a lower portion of the cable 110. An upper portion of the cable 110 is a portion adjacent to the first surface 101A of the body plate 101, and the lower portion of the cable 110 is a portion adjacent to the second surface 101B of the body plate 101. When the cable 110 is bent, sagging occurs at the upper portion of the cable 110 due to gravity. Accordingly, the support unit 120 may be coupled to the lower portion of the cable 110 to restrict the sagging of the cable 110.

The support unit 120 may include a plurality of clamps 122 and a connection member 124.

The clamp 122 may include a first portion 122A adjacent to and surrounding the cable 110 and a second portion 122B disposed on each of both opposing sides of the first portion 122A. The first portion 122A of the clamp 122 may include a hole. The cable 110 may be received in the hole. The first portion 122A of the clamp 122 surrounds the cable 110 and may restrict the movement of the cable 110. For example, the clamp 122 may restrict the twisting of the cable 110. The clamp 122 may clamp the sub-cables to each other so that they move as a single body.

The plurality of clamps 122 may be spaced apart from each other in the length direction of the cable 110. The plurality of clamps 122 spaced apart from each other may be coupled to each other via the connection member 124.

The connection member 124 may be coupled to the second portion 122B of the clamp 122. The connection member 124 may be coupled to the second portion 122B of one clamp 122 and the second portion 122B of another clamp 122 spaced apart from one clamp 122. For example, one clamp 122 and another clamp 122 as spaced apart from each other may be coupled to each other via the connection member 124, and thus may move as a single body.

The connection member 124 may be disposed on each of the opposing sides of the clamp 122. The connection member 124 may be spaced apart from the cable 110. The cable 110 may be disposed in a space between the connection members 124. As the wafer stage 100 moves, and thus the cable 110 is bent, the cable 110 may come into contact with the clamp 122. However, in this case, the cable 110 may not contact the connection member 124.

The connection member 124 may be in a shape of a thin plate. The connection member 124 may include an elastic material. For example, the connection member 124 may include elastic stainless steel.

The protective unit 130 may be disposed under the cable 110. The protective unit 130 may collide with the support unit 120 as the wafer stage 100 moves. In some embodiments, the protective unit 130 may be positioned in a corresponding manner to the connection member 124 of the support unit 120. For example, the protective unit 130 may be disposed on each of the opposing sides of the cable 110 so as to collide with the connection member 124 as the cable 110 sags.

The protective unit 130 may include a protective unit frame 132 and a protective cover 134.

The protective unit frame 132 may be disposed on a lower frame. The protective unit frame 132 may be fixed to a lower frame. In some embodiments, the protective unit frame 132 may include a plastic material. However, embodiments are not limited thereto.

The protective cover 134 may be disposed on the protective unit frame 132. The protective cover 134 may be fixed onto the protective unit frame 132.

The protective cover 134 may cover an upper surface of the protective unit frame 132. The protective cover 134 may collide with the connection member 124. The protective cover 134 covers the upper surface of the protective unit frame 132 such that the protective unit frame 132 may not directly collide with the connection member 124.

A width of the protective cover 134 may be equal to a width of the connection member 124. However, embodiments are not limited thereto. In some embodiments, the width of the protective cover 134 may be different from the width of the connection member 124. When the width of the protective cover 134 is greater than the width of the connection member 124, the width of the protective unit frame 132 may have a size such that the protective unit frame 132 does not collide with the cable 110. When the protective cover 134 and the connection member 124 collide with each other, the protective cover 134 may be spaced apart from the cable 110 and may not collide therewith.

A length of the protective cover 134 may be equal to or smaller than a length of the connection member 124. While the wafer stage 100 moves, the protective cover 134 may collide with the connection member 124, and the protective cover 134 may not collide with the clamp 122. For example, when the protective cover 134 and the connection member 124 collide with each other, the protective cover 134 may be disposed between the clamps 122 spaced apart from each other.

The protective unit 130 may be made of ultra high molecular weight polyethylene (UHMWPE). For example, the protective cover 134 of the protective unit 130 may include the UHMWPE. However, embodiments are not limited thereto. In some embodiments, the protective cover 134 may include a material having a molecular weight greater than several million grams per 1 mol. In addition, when the material is abraded to particles which in turn are dispersed into gas, substances other than carbon (C) and hydrogen (H) should not be produced. When the particle includes substances other than carbon (C) and hydrogen (H), the substance may react with the plasma in the lithography apparatus, such that the operation of the lithography apparatus may be stopped.

In the lithography apparatus according to some embodiments, the protective unit 130 may not include the protective unit frame 132. The protective unit 130 may be composed of only the protective cover 134. In this case, the protective cover 134 may be fixed to the lower frame. The protective cover 134 may collide with the connection member 124.

Referring to FIG. 4 and FIG. 5, the operation of the cable 110, the support unit 120 and the protective unit 130 is described.

As shown in FIG. 4, sagging may not occur at the lower portion of the cable 110 depending on a location of the wafer stage 100. The support unit 120 may be disposed along a curved surface of the cable 110. The support unit 120 may be disposed on the side surface of the body plate 101. The support unit 120 may be spaced apart from the protective unit 130. The support unit 120 may not collide with the protective unit 130.

As shown in FIG. 5, the wafer stage 100 may move. As the wafer stage 100 moves in the first direction DR1, a length of a portion of the cable 110 disposed on the first surface 101A of the body plate 101 may be reduced. On the other hand, a length of a portion of the cable 110 disposed on the second surface 101B of the body plate 101 may be increased. As the length of the portion of the cable 110 on the second surface 101B of the body plate 101 increases, the lower portion of the cable 110 may sag.

The support unit 120 may partially restrict the sagging of the lower portion of the cable 110. Furthermore, the support unit 120 may collide with the protective unit 130 to partially restrict the sagging of the lower portion of the cable 110. The support unit 120 may restrict the sagging and the twisting of the cable 110, compared to a case in which the support unit 120 is absent. The support unit 120 may collide with the protective unit 130 such that the lower portion of the cable 110 is supported thereon so as to be flat.

In the lithography apparatus according to related art, the wafer stage 100 may reciprocate in the first direction DR1. As a result, the support unit 120 and the protective unit 130 may continuously collide with each other. Due to the collision, particles may be produced from the support unit 120 and the protective unit 130. For example, when there is no protective cover 134 of the protective unit 130, the collision occurs between the support unit 120 and the protective unit frame 132. The collision results in production of metal or plastic-based particles. The particles may scatter and contaminate the wafer. Thus, the yield of the lithography apparatus may be reduced.

However, in the lithography apparatus according to embodiments, the protective cover 134 of the protective unit 130 may be made of a polymer having a molecular weight of several million grams or larger per 1 mol, and does not produce an element other than carbon (C) and hydrogen (H) when wearing out. The protective cover 134 may include, for example, the UHMWPE. When the UHMWPE is used as the material of the protective cover 134, an amount of the produced particles may be reduced compared to that when a plastic or metal-based material is used as the material of the protective cover 134. Furthermore, the UHMWPE has a mean free path. Thus, even when the particles made thereof are produced, a probability at which the particles scatter and reach to the wafer is low.

Therefore, the protective unit 130 including the protective cover 134 according to embodiments may reduce the production of the particles in the lithography apparatus. Thus, reliability of the lithography apparatus may be improved, and a process yield may be improved.

Figure 6:
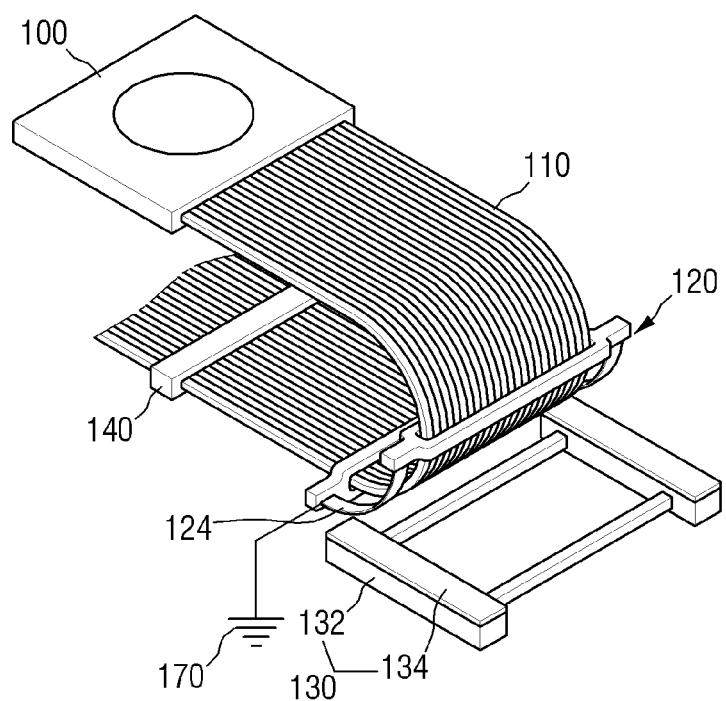
FIG. 6 is a diagram illustrating a lithography apparatus according to some embodiments.

FIG. 6 is a diagram for illustrating a lithography apparatus according to some embodiments. For the convenience of description, the following description is based on differences thereof from those as set forth above with reference to FIG. 1 to FIG. 5.

Referring to FIG. 6, the lithography apparatus according to some embodiments may further include a grounding unit 170.

The grounding unit 170 may be connected to the support unit 120. The grounding unit 170 may be connected to the connection member 124 of the support unit 120, for example. The grounding unit 170 may remove electrical energy stored in the support unit 120.

As the wafer stage 100 moves in the first direction DR1, collision and friction between the support unit 120 and the protective unit 130 may occur. As the wafer stage 100 repeatedly moves, the electrical energy stored in the support unit 120 may increase due to the friction. The grounding unit 170 may remove the electrical energy. As the electrical energy of the support unit 120 is removed, carbonization of the support unit 120 and units around the support unit 120 may be avoided. Furthermore, since the electrical energy of the support unit 120 is removed, the production of particles may be reduced.

Figure 7:
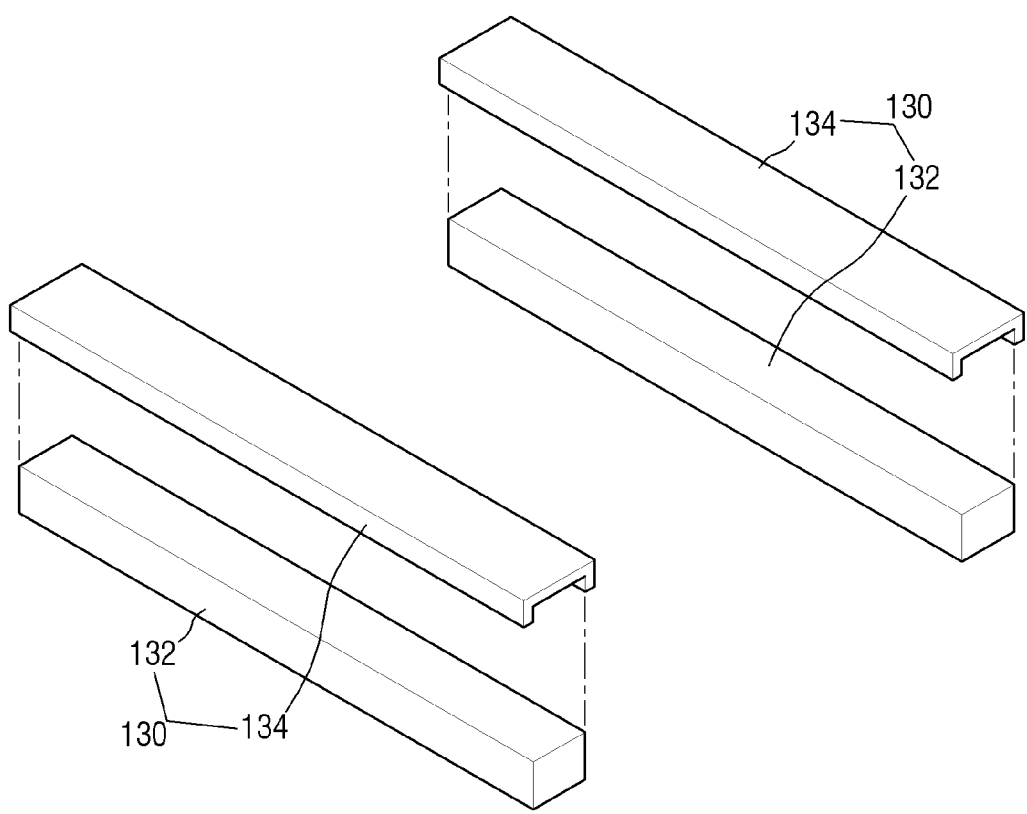
FIG. 7 is a diagram illustrating a protective unit of a lithography apparatus according to some embodiments.

FIG. 7 is a diagram for illustrating a protective unit of a lithography apparatus according to some embodiments. For the convenience of description, the following description is based on differences thereof from those as set forth above with reference to FIG. 1 to FIG. 5.

Referring to FIG. 7, the protective unit 130 may include the protective unit frame 132 and the protective cover 134.

The description of the protective unit frame 132 is the same as described above.

The protective unit cover 134 may cover an upper surface and a side surface of the protective unit frame 132. The upper surface of the protective unit cover 134 may collide with the connection member 124.

The width of the protective cover 134 may be equal to the width of the connection member 124. However, embodiments are not limited thereto. In some embodiments, the width of the protective cover 134 may be different from the width of the connection member 124. When the width of the protective cover 134 is greater than the width of the connection member 124, the width of the protective unit frame 132 may be sized such that the protective unit frame 132 does not collide with the cable 110. When the protective cover 134 and the connection member 124 collide with each other, the protective cover 134 may be spaced from the cable 110 and may not collide therewith.

The length of the protective cover 134 may be equal to or smaller than the length of the connection member 124. While the wafer stage 100 moves, the protective cover 134 may collide with the connection member 124, and the protective cover 134 may not collide with the clamp 122. For example, when the protective cover 134 and the connection member 124 collide with each other, the protective cover 134 may be disposed between the clamps 122 spaced from each other.

The protective cover 134 in FIG. 7 may include a larger amount of UHMWPE, compared to that of the protective cover 134 as described in FIG. 1 to FIG. 5. In this case, a surface roughness Ra and a density of the UHMWPE may be changed such that the properties thereof may be improved. For example, as the properties of the UHMWPE are improved, an amount of particles produced in the protective cover 134 may be reduced.

Figure 8:
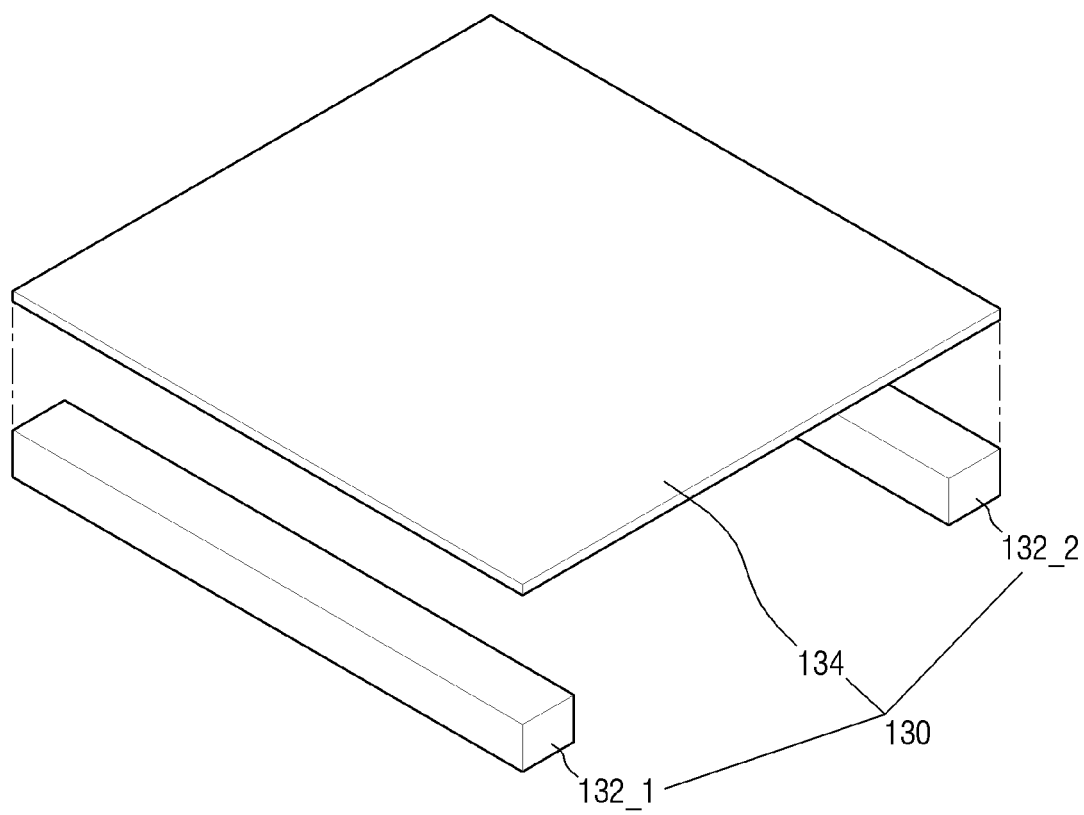
FIG. 8 and FIG. 9 are diagrams illustrating a protective unit of a lithography apparatus according to some embodiments.
Figure 9:
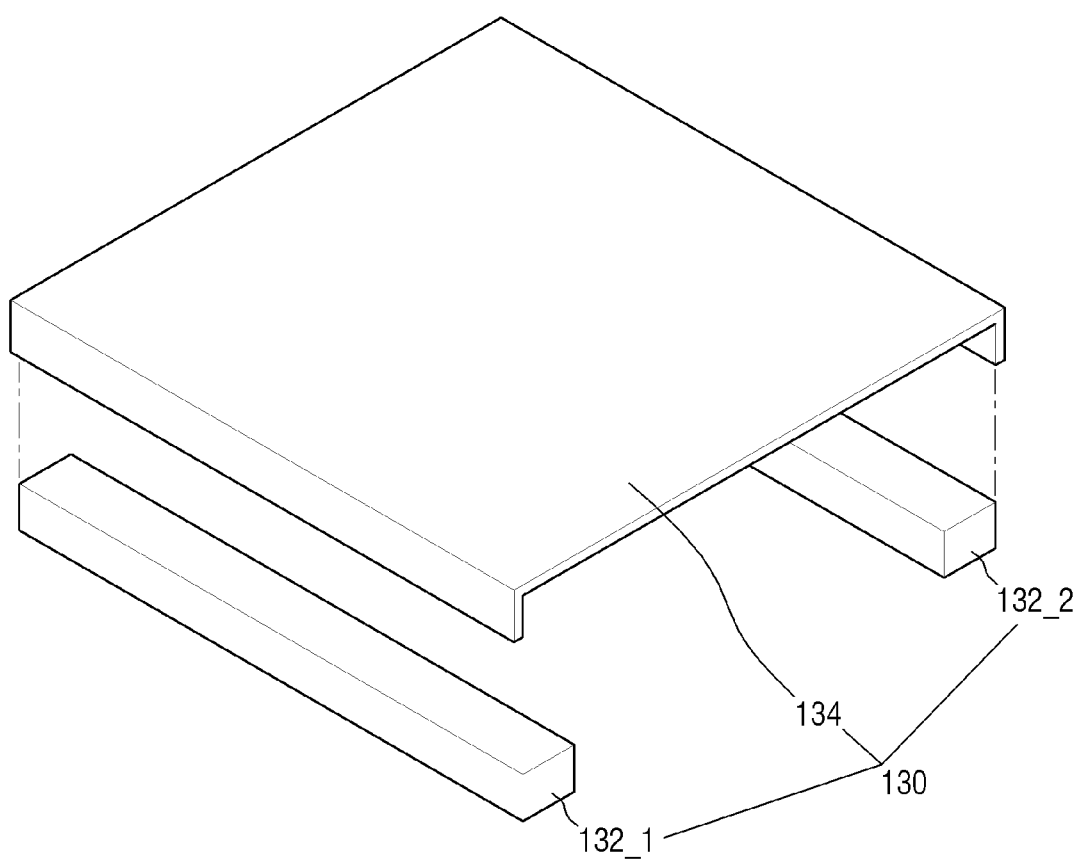

FIG. 8 and FIG. 9 are diagrams for illustrating a protective unit of a lithography apparatus according to some embodiments. For the convenience of description, the following description is based on differences thereof from those as set forth above with reference to FIG. 1 to FIG. 5 and FIG. 7.

Referring to FIG. 8, the protective unit 130 may include a plurality of protective unit frames 132 and the protective cover 134.

The plurality of protective unit frames 132 may include a first protective unit frame 132_1 and a second protective unit frame 132_2. The first protective unit frame 132_1 and the second protective unit frame 132_2 may be spaced apart from each other in the second direction DR2. The protective cover 134 may cover an upper surface of the first protective unit frame 132_1 and an upper surface of the second protective unit frame 132_2. The protective cover 134 may extend from the first protective unit frame 132_1 to the second protective unit frame 132_2.

The length of the protective cover 134 may be equal to or smaller than the length of the connection member 124. While the wafer stage 100 moves, the protective cover 134 may collide with the connection member 124, and the protective cover 134 may not collide with the clamp 122. For example, when the protective cover 134 and the connection member 124 collide with each other, the protective cover 134 may be disposed between the clamps 122 spaced apart from each other.

Referring to FIG. 9, the protective cover 134 may cover a side surface of the first protective unit frame 132_1 and a side surface of the second protective unit frame 132_2.

The protective cover 134 in FIG. 8 and FIG. 9 may include a larger amount of the UHMWPE, compared to that of the protective cover 134 as described in FIG. 1 to FIG. 5. In this case, a surface roughness Ra and a density of the UHMWPE may be changed such that the properties thereof may be improved. For example, as the properties of the UHMWPE are improved, an amount of particles produced in the protective cover 134 may be reduced.

Figure 10:
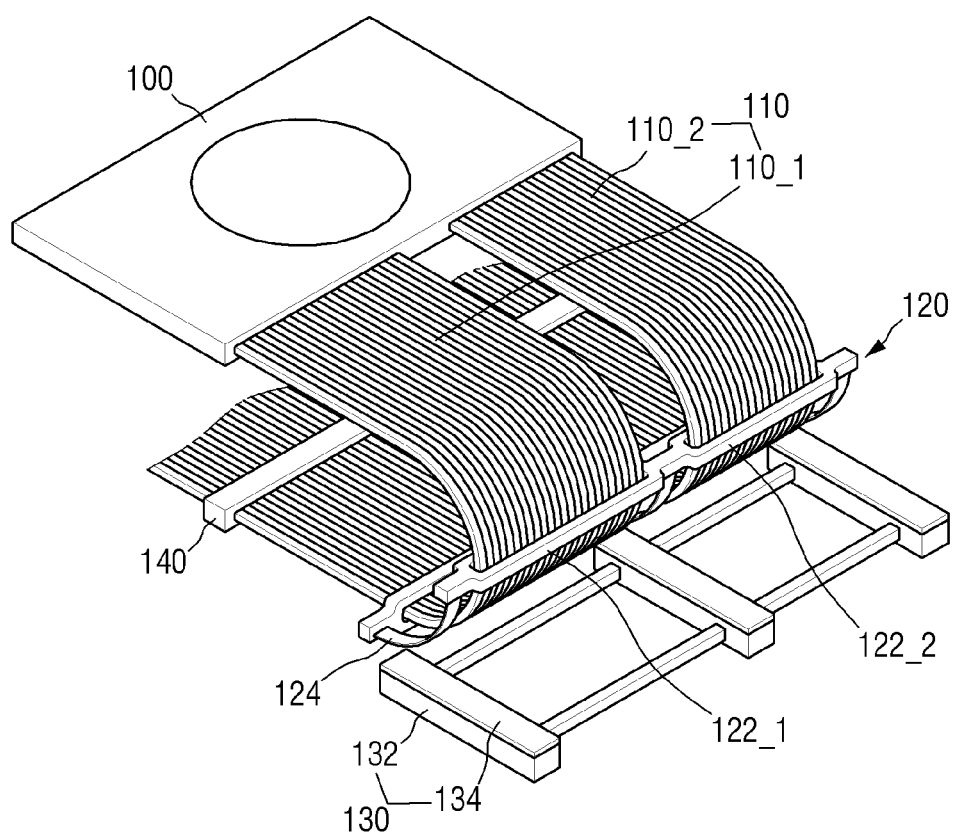
FIG. 10 is a diagram illustrating a lithography apparatus according to some embodiments.

FIG. 10 is a diagram for illustrating a lithography apparatus according to some embodiments. For the convenience of description, the following description is based on differences thereof from those as set forth above with reference to FIG. 1 to FIG. 5.

Referring to FIG. 10, the lithography apparatus according to some embodiments may include a first cable 110_1 and a second cable 110_2.

The first cable 110_1 and the second cable 110_2 may be connected to the wafer stage 100. Each of the first cable 110_1 and the second cable 110_2 may extend in the first direction DR1.

One end of each of the first cable 110_1 and the second cable 110_2 may be connected to the wafer stage 100. The other end of each of the first cable 110_1 and the second cable 110_2 may be fixed to the cable fixing member 140. Each of the first cable 110_1 and the second cable 110_2 may extend in a length direction. For example, sub-cables of each of the first cable 110_1 and the second cable 110_2 extending from the cable fixing member 140 to the wafer stage 100 may be equal to each other. Each of the first cable 110_1 and the second cable 110_2 may be connected to the wafer stage 100 and may extend along the first surface 101A, the side surface, and the second surface 101B of the body plate 101.

The first cable 110_1 may be spaced apart from the second cable 110_2 in the second direction DR2. Each of the first cable 110_1 and the second cable 110_2 may be used as a path for transmitting data.

The support unit 120 may include a first clamp 122_1, a second clamp 122_2 and the connection member 124.

The first clamp 122_1 may clamp the sub-cables of the first cable 110_1 with each other. The first clamp 122_1 may restrict the movement of the first cable 110_1. For example, the first clamp 122_1 may restrict twisting of the first cable 110_1.

The second clamp 122_2 may clamp the sub-cables of the second cable 110_2 with each other. The second clamp 122_2 may restrict the movement of the second cable 110_2. For example, the second clamp 122_2 may restrict twisting of the second cable 110_2. The number of sub-cables which each of the first clamp 122_1 and the second clamp 122_2 clamp with each other may be smaller than that which the clamp 122 in FIG. 1 to FIG. 5 clamp with each other. For example, the number of sub-cables which each of the first clamp 122_1 and the second clamp 122_2 clamp with each other may be reduced. Thus, the twisting of each of the first cable 110_1 and the second cable 110_2 may be reduced when the wafer stage 100 moves.

The first clamp 122_1 and the second clamp 122_2 may be integrally formed with each other. The clamp 122 may include the first portion 122A surrounding the cable 110 and the second portion 122B disposed on each of each of both opposing sides of the first portion 122A. That is, when the clamp 122 includes the first clamp 122_1 and the second clamp 122_2, the number of the first portions 122A may be two, and the number of the second portions 122B may be three.

The connection member 124 may couple to the second portion 122B. The connection member 124 may be coupled to the second portion 122B of one clamp 122 and the second portion 122B of another clamp 122 spaced apart therefrom. For example, one clamp 122 and another clamp 122 spaced apart from each other may be coupled to each other via the connection member 124 and thus may move as a single body. The number of the connection members 124 may be equal to the number of the second portions 122B of the clamp 122.

The lithography apparatus according to some embodiments may include a plurality of protective units 130. The number of the protective units 130 may correspond to the number of the connection members 124. For example, when the number of the connection members 124 is three, the number of the protective units 130 may be three.

While embodiments have been described with reference to the figures, it will be understood by those of ordinary skill in the art that various changes in form and details may be made therein without departing from the spirit and scope as defined by the following claims and their equivalents.

What is claimed is:

1. A lithography apparatus comprising:
   a wafer stage;
   a cable connected to the wafer stage, the cable being configured to bend based on the wafer stage moving;
   a support unit configured to prevent the cable from sagging, the support unit comprising a plurality of clamps configured to restrict movement of the cable and a connection member connecting the plurality of clamps to each other; and
   a protective unit under the cable, the protective unit being configured to collide with the support unit based on the wafer stage moving, wherein the protective unit comprises ultra-high molecular weight polyethylene (UHMWPE).

2. The lithography apparatus of claim 1, wherein the protective unit further comprises a protective unit frame and a protective cover on the protective unit frame, and
wherein the protective cover comprises UHMWPE.

3. The lithography apparatus of claim 2, wherein the connection member is configured to collide with the protective unit based on the cable being bent.

4. The lithography apparatus of claim 1, further comprising a grounding unit connected to the support unit.

5. The lithography apparatus of claim 1, wherein each of the plurality of clamps comprises a first portion adjacent to the cable and a second portion on each of opposing sides of the first portion, and
wherein the connection member is on the second portion.

6. The lithography apparatus of claim 5, wherein the protective unit is configured to collide with the connection member and not collide with the plurality of clamps.

7. The lithography apparatus of claim 1, further comprising a lower frame, the protective unit being on the lower frame,
wherein the lower frame is configured to not collide with the cable.

8. The lithography apparatus of claim 1, wherein the connection member is configured to not contact the cable.

9. The lithography apparatus of claim 1, wherein the protective unit further comprises a protective unit frame and a protective cover on an upper surface and side surfaces of the protective unit frame, and
wherein the protective cover comprises UHMWPE.

10. The lithography apparatus of claim 1, wherein the connection member comprises stainless steel.

11. A lithography apparatus comprising:
a chamber;
a body plate in the chamber, the body plate comprising a first surface and a second surface opposite to the first surface;
a stage configured to move on the first surface of the body plate;
a cable on the stage, the cable extending to the second surface of the body plate, the cable being configured to bend based on the stage moving;
a support unit configured to prevent the cable from sagging;
a grounding unit on the support unit; and
a protective unit under the cable, the protective unit being configured to collide with the support unit,
wherein the protective unit comprises ultra-high molecular weight polyethylene (UHMWPE).

12. The lithography apparatus of claim 11, wherein the support unit comprises a plurality of clamps configured to restrict movement of the cable and a connection member connecting the plurality of clamps to each other.

13. The lithography apparatus of claim 12, wherein the connection member is configured to collide with the protective unit based on the cable being bent.

14. The lithography apparatus of claim 12, wherein the connection member is on each of opposing sides of the cable.

15. The lithography apparatus of claim 11, wherein the protective unit further comprises a protective unit frame and a protective cover on the protective unit frame, and
wherein the protective cover comprises UHMWPE.

16. The lithography apparatus of claim 11, wherein the stage comprises a wafer stage configured to support a wafer.

17. The lithography apparatus of claim 11, further comprising a lower frame, the protective unit being on the lower frame,
wherein the lower frame is configured to not collide with the cable.

18. The lithography apparatus of claim 11, wherein the protective unit further comprises a protective unit frame and a protective cover on an upper surface and side surfaces of the protective unit frame, and
wherein the protective cover comprises UHMWPE.

19. A lithography apparatus comprising:
a chamber;
a wafer stage in the chamber, the wafer stage being configured support a wafer;
a cable on the wafer stage, the cable being configured to bend based on the wafer stage moving;
a support unit configured to prevent the cable from sagging, the support unit comprises a plurality of clamps configured to restrict movement of the cable and a connection member connecting the plurality of clamps to each other;
a grounding unit on the support unit; and
a protective unit under the cable, the protective unit being configured to collide the support unit based on the wafer stage moving,
wherein the protective unit comprises ultra-high molecular weight polyethylene (UHMWPE).

20. The lithography apparatus of claim 19, wherein the protective unit further comprises a protective unit frame and a protective cover on the protective unit frame, and
wherein the protective cover comprises UHMWPE.

* * * * *